(12) United States Patent
Caskey et al.

(10) Patent No.: US 7,147,735 B2
(45) Date of Patent: Dec. 12, 2006

(54) VIBRATABLE DIE ATTACHMENT TOOL

(75) Inventors: Terrence C. Caskey, Mesa, AZ (US);
Vassoudevane Lebonheur, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 68 days.

(21) Appl. No.: 10/897,706

(22) Filed: Jul. 22, 2004

(65) Prior Publication Data

US 2006/0016541 A1    Jan. 26, 2006

(51) Int. Cl.
*B32B 37/00* (2006.01)

(52) U.S. Cl. .................... 156/73.5; 156/73.6; 156/580; 156/583.1

(58) Field of Classification Search ............. 156/73.1, 156/73.5, 73.6, 580.1, 580.2, 583.1, 583.2, 156/228, 580; 228/110.1, 112.1, 1.1, 2.1, 228/4.5
See application file for complete search history.

(56) References Cited

U.S. PATENT DOCUMENTS

| | | | |
|---|---|---|---|
| 3,388,848 A | 6/1968 | Youmans et al. | |
| 4,145,390 A | 3/1979 | Zschimmer | |
| 5,690,766 A | 11/1997 | Zwick | |
| 6,321,973 B1 | 11/2001 | Minamitani et al. | |
| 6,467,670 B1 * | 10/2002 | Higashi et al. | ............... 228/1.1 |
| 6,564,988 B1 * | 5/2003 | Shiraishi et al. | ......... 228/110.1 |
| 6,706,130 B1 * | 3/2004 | Minamitani et al. | .......... 156/64 |
| 6,778,038 B1 * | 8/2004 | Takeishi et al. | ............. 333/133 |
| 2001/0051396 A1 | 12/2001 | Iwahashi et al. | |
| 2002/0115278 A1 | 8/2002 | Kawai | |
| 2003/0019561 A1 | 1/2003 | Tominaga et al. | |
| 2003/0139004 A1 | 7/2003 | Yoshida | |
| 2004/0047127 A1 | 3/2004 | Yamauchi et al. | |

\* cited by examiner

*Primary Examiner*—James Sells
(74) *Attorney, Agent, or Firm*—Schwabe, Williamson & Wyatt, P.C.

(57) ABSTRACT

A die attachment includes a placement head, a platen, and a vibration mechanism to vibrate at least a selected one of the placement head and platen while a die and a substrate mounted on the placement head and the platen, respectively, are in contact.

16 Claims, 4 Drawing Sheets

VIBRATABLE DIE ATTACHMENT TOOL

BACKGROUND OF THE INVENTION

1. Field of the Invention

The present invention relates to electronic devices, and in particular, to assembly of electronic devices.

2. Description of Related Art

FIG. 1 illustrates a flip-chip die attachment process wherein an integrated circuit (IC) die 10 is mounted to a die carrier or substrate 12 so as to form an IC package 14. An array of die metal bumps 16 are attached to die bonding pads (not shown) located on the input/output (I/O) side of the die 10. Also, a matching array of substrate solder bumps 18, typically with a lower melting point than the die metal bumps 16, are attached to substrate bonding pads (not shown) on the substrate 12. With use of a die attachment or bonding tool (not shown), the die 10 is aligned so that the die metal bumps 16 of the die 10 are facing the substrate solder bumps 18 of the substrate 12. After being aligned, the die attachment tool moves the die 10 in a vertical direction toward the substrate 12 to apply compressive forces or pressures between the bumps 16 and 18. This vertical direction is indicated by a directional arrow 20. By reflowing the solder, the die metal bumps 16 and the substrate solder bumps 18 simultaneously joined to form solder joints (i.e., solder connections) that interconnect the die 10 to the substrate 12. More specifically, the substrate solder bumps 18, with their lower melting point, may wet the die metal bumps 16 to form the solder joints, which in turn form a plurality of electrical and mechanical interconnections between the die 10 and substrate 12. These solder joints are commonly referred to as Control Collapsed Chip Connection (C4) bumps, regardless of whether the IC package 14 is a ball grid array (BGA) package with solder balls on the landside of the substrate 12 or pin grid array (PGA) package with pins on the landside of the substrate 12. These solder balls or pins are used to interconnect the IC package to a printed circuit board (not shown).

With some flip-chip IC packages, a no-flow underfill material 22, used for mechanical support and electrical insulation, is interposed between the die 10 and the substrate 12. Additionally, the no-flow underfill material 22 may include conductive fillers 24, which may be either solid or liquid materials. One issue with use of no-flow underfill material is poor solder joint quality, which may result from non-wets, bump misalignments, and entrapment of underfill material and/or its fillers. Entrapment of the underfill material and/or its filler within the solder joint may have a severe impact to solder joint's current carrying capability.

Current no-flow underfill technology relies solely on compressive forces to expel underfill material from between bumps during solder joint formation using the die attachment tool. A "squeeze flow", which is produced by these compressive forces, is sufficient to remove some of the material from between the bumps before connection is made. However, this process is not generally capable of completely removing the underfill material from between the bumps. More specifically, this technology utilizes compression forces during the solder re-flow process in order to physically repel and squeeze the underfill material from the interconnect area between the die 10 and substrate 12. However, there are limitations on how much force may be applied on the die 10 before there may be a negative impact to silicon structures, such as damage to the interlayer dielectric (ILD), the thin film capacitor (TFC), the polylmide and/or like structures and there may also be the formation of bump shorts and the like.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
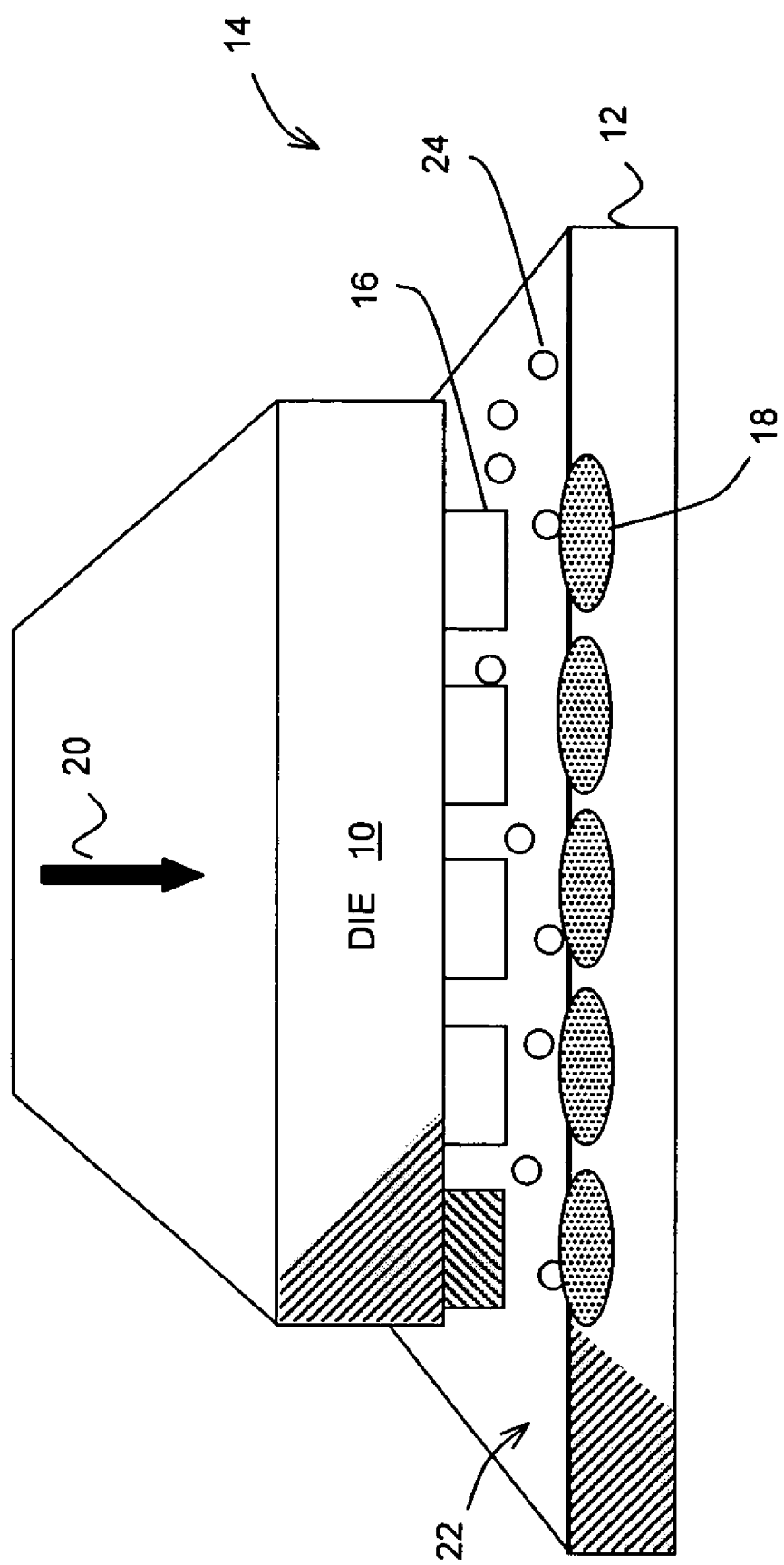
FIG. 1 is a cross-sectional perspective view of an IC package being assembled by a prior art assembly process.
Figure 2:
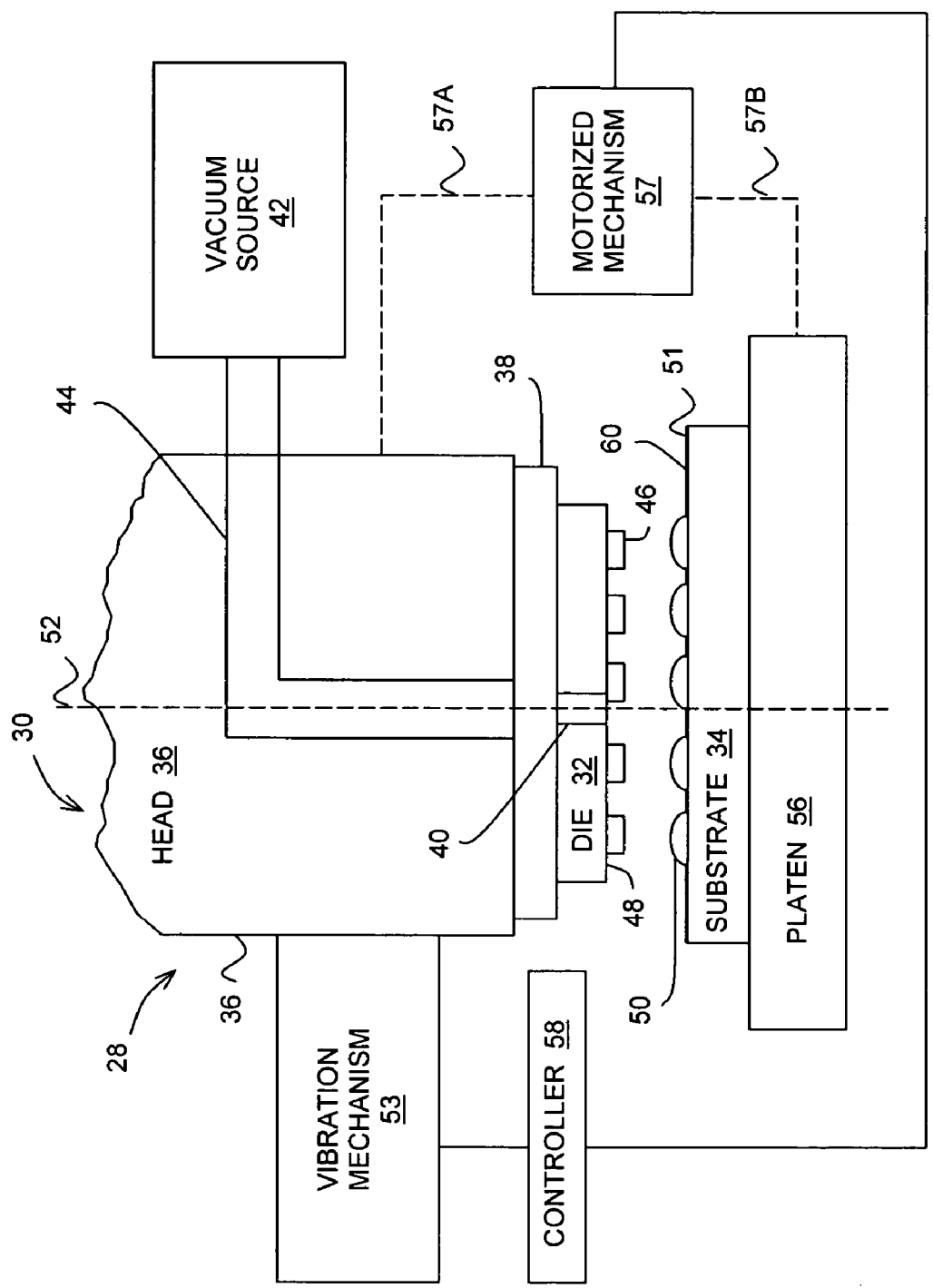
FIG. 2 is a block diagram of an assembly system including a die attachment tool, according to one embodiment of the present invention, shown assembling an IC package.
Figure 3:
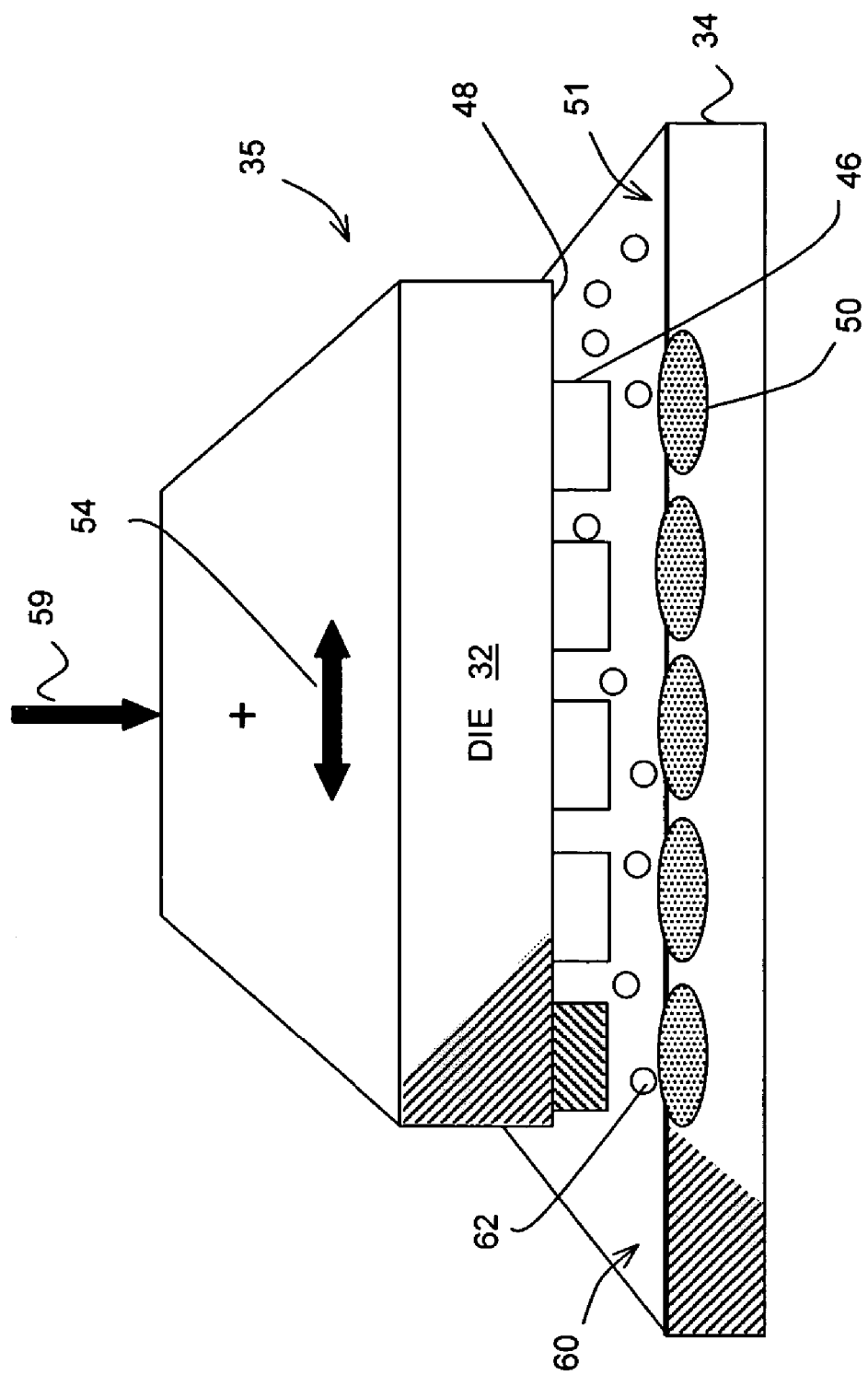
FIG. 3 is a cross-sectional, perspective view of the IC package of FIG. 2 during assembly.

Referring to FIGS. 2 and 3, there is disclosed an assembly system 28 for die packaging operations. The assembly system 28 includes a die attachment tool 30 (such as a thermo-compression bonder), according to one embodiment of the present invention, for use in a flip-flop die attachment process, according to one method of the present invention, wherein an integrated circuit (IC) die 32 may be bonded to substrate 34 (i.e., die carrier) to form an IC package 35. The die attachment tool 30 may include a placement head 36 for temporarily holding the die 32. In various embodiments, the placement head 36 is adapted to be movable, to facilitate movement of the die 32. In one embodiment, the placement head 36 may include a pulsed heating element 38 with an aperture 40. In one embodiment, a vacuum source 42 may be fluidly coupled to the aperture 40 by way of a tubular member 44. In one embodiment, the die 32 may include a number of die bumps 46 on its underside 48 (i.e., I/O side) and the substrate 34 may include a number of substrate bumps 50 on its die side 51. In various embodiments, the die bumps 46 may be metal bumps, and the metal bumps may be organized in a substantially array configuration. In various embodiments, the substrate bumps 50 may be solder bumps, and the solder bumps may also be organized in a substantially array configuration. The substrate solder bumps 50 may have a lower melting point than the die metal bumps 46. The die side 51 of the die 32 and the underside 48 of the substrate 34 are substantially perpendicular to a center axis 52 of the die attachment tool 30. In another embodiment, the die may have an array of die solder bumps and the substrate may have a matching array of substrate metal bumps.

In one embodiment, a vibration mechanism 53 may laterally engage a vertical side of the placement head 36 to interpose vibration forces or waves which are substantially parallel to the planar surfaces of the die 32 and the substrate 34, e.g., the underside 48 and the die-side 52, and substantially perpendicular to the center axis 52. The vibration mechanism 53 may be implemented in a number of ways, such as using a commercially available piezoelectric element attached to one of the vertical walls of the placement head 36. In one embodiment, the oscillating movement or displacement of the placement head 36 caused by the applied vibration waves or forces of the vibration mechanism 53 may be applied substantially in the two-way direction of the double-ended arrow 54. In another embodiment, multiple vibration mechanisms 53 may be used, such as two vibration mechanisms 53 disposed at right angles to each other so as to engage adjacent vertical sides of the placement head 36; thereby introducing a set of perpendicular vibration waves that may again be substantially parallel to the planar surfaces of the die 32 and substrate 34 and the center axis 52.

In one embodiment, the die attachment tool 30 may include a plate or platen 56 on which the substrate 34 may be temporarily and removably mounted. In another embodiment, the platen 56 may be vibrated by a vibration mechanism instead of the placement head 36. In yet another embodiment, both the placement head 36 and the platen 56 may be vibrated with the a pair of vibration mechanisms having force waves, which are perpendicular to the center axis, being aligned or not aligned in the same oscillating two-way direction.

During the packaging operations, the die 32 may be temporarily and removably attached to the pulsed heating element 38 by a suction generated by the vacuum source 42. The die 32 may be picked up by the placement head 36 and then relocated by movement of the placement head 36 so that the die 32 may be aligned over the top of the substrate 34. The die attachment tool 30 may further include a motorized mechanism 57 mechanically attached by a pair of connecting members 57A and 57B to the placement head 36 and the platen 56 to move the head 36 and platen 56 together. The connecting members 57A and 57B, as shown by dashed lines, are generalized representations of the movable mounting components in commercially-available die attachment tools used to move the placement head 36 and the platen 56 together. Further, in various embodiments, the assembly system 28 may include a controller 58 (such as a microprocessor) coupled to one or both of vibration mechanism 53 and motorized mechanism 57, to control the operation the vibration mechanism 53 and/or the motorized mechanism 57.

In one embodiment, once the placement head 36 and platen 56 are aligned with respect to the center axis 52, the motorized mechanism 57 may move the placement head 36 in a downward vertical direction along the center axis 52 toward the substrate 34 on a stationary platen 56 so as to apply compressive or contact forces between the bumps 46 and 50. As the compressive forces are applied, the die metal bumps 46 may be bonded to the substrate solder bumps 50 in a thermal compression process. In another embodiment, the platen 56 may move toward a stationary placement head 36. In yet another embodiment, the placement head 36 and the platen 56 may move simultaneously toward each other to form the compressive forces. In each of these embodiments, the relative movement of the head 36 and platen 56 caused by the motorized mechanism 57, is parallel to the center axis 52, and may be defined as a "path of movement". In summary, the path of movement may be caused by moving of the head 36 and/or the platen 56 so that they move together and come into contact to apply the compressive forces.

In the first described embodiment wherein the placement head 36 moves toward the stationary platen 56, the vertical arrow 59 indicates the direction of the movement of the placement head 36 toward the platen 56 along the center axis 52. Once contact is made between the bumps 46 and 50, a plurality of downward forces applied by the placement head 36 against the die 32 may be illustrated by a plurality of downward force vectors (not shown) which may be substantially parallel with the center axis 52 and in the direction of the arrow 59. Since the platen 56 may remain stationary, a plurality of counteracting upward forces may be applied by the platen 56 against the substrate 34 as the bumps 46 and 50 engage each other. These upward forces may be illustrated by a plurality of upward force vectors (not shown) which may be parallel to the center axis 52 and parallel, but in the opposite direction to, the arrow 59. The downward forces and the upward forces merge to cause the previously-mentioned compressive forces between the metal die bumps 46 of the die 32 and the substrate solder bumps 50 of the substrate 34. The same compressive forces may be achievable regardless of whether the head 36 moves toward a stationary platen 56 or the platen 56 moves toward a stationary head 36 or the head 36 and platen 56 simultaneously move toward each other.

In summary, the placement head 30 and the platen 56 may move together along the path of movement, which may be substantially parallel with the center axis 52. The oscillating motion, induced by the force waves of the vibrating mechanism 53, of the placement head 36 and/or the platen 56 may be substantially perpendicular to the center axis 52 and the path of movement and substantially parallel to the die-side 51 of the substrate 34 and underside 48 of the die 32. Hence, the die 32 and/or the substrate 34 may be repeatedly displaced relative to the path of movement and the center axis 52, with such displacements being periodically induced at a desired, predetermined frequency. The compressive forces generated by the placement head 36 and the platen 56 coming together may be substantially parallel to the center axis 52 and the path of movement and substantially perpendicular to the underside 48 of die 32 and the die-side 51 of the substrate 34. The compressive forces and oscillating vibration forces or force waves may be substantially perpendicular to each other.

A layer of a no-flow underfill material 60, used for mechanical support and electrical insulation, is interposed between the die 32 and the substrate 34. Additionally, the no-flow underfill material 60 may include conductive fillers 62, which may be either solid or liquid materials. Prior to bonding, the array of substrate solder bumps 50 may be attached to the die-side 51 of the substrate 34 with no-flow material 60 surrounding the bumps 50. Since the substrate solder bumps 50 may have a lower melting point than the die metal bumps 46, during bonding the substrate solder bumps 50 may "wet" the die metal bumps 46. As will be described in detail hereinafter, the vibration mechanism 53 may provide a sweeping action to prevent entrapment of the underfill material 60 and/or its fillers 62 in the solder joints formed during bonding. After bonding, the underfill material 60, with its conductive fillers 62, may be cured to provide adhesion between the die 32 and the substrate 34.

The die attachment tool 30 is designed to reduce entrapment of the underfill material 60 in the solder joint joints formed by thermal compression bonding process when the die metal bumps 46 are bonded to the substrate solder bumps 50. The vibrating placement head 36 may vibrate at a desired frequency such that the underfill material 60 and the fillers 62, if any, may be 'swept' out of the way during the bump interconnection process. More specifically, the vibrating placement head 36 may impart a lateral sweeping motion to the die 32 during placement of the die 32 onto the substrate 34, thereby allowing the die metal bumps 46 (which do not melt during the thermal compression process) to mechanically clear the underfill material 60 and/or the fillers 62 from the substrate solder bumps 50 as they approach one another. The compressive forces may be applied in directions substantially parallel with the center axis 52, whereas the lateral sweeping forces generated by the vibration mechanism 53 may be substantially perpendicular the center axis 52, but substantially parallel to the planar surfaces of the underside 48 and die side 51.

The lateral sweeping motion of the vibrating placement head 36 also may create high shear stresses on the underfill material 60, which may have the effect of locally reducing the viscosity of the underfill material 60 and fillers 62 around the substrate solder bumps 50. This reduced viscosity may further facilitate the flow and expulsion of the underfill material 60 and fillers 62 from the interconnect solder joint interface, i.e., where the bumps 46 and 50 meet. This viscosity reduction, based upon increase of shear forces, is a physical property of polymers and is referred to as the "shear thinning effect". The effect may be described by a power law model as follows:

$$\tau = k(\gamma^*)^{\wedge}(n)$$

where K and n are material parameters (k=consistency index), $\tau$ is the viscosity, and $\gamma^*$ is the shear rate. For low shear rates, n=1 and the viscosity is equal to k (Newtonian regime). For higher shear rates, n<1 and a shear thinning effect is observed.

In one embodiment, the capability to provide both heat and pressure of the thermal compression process may be provided through the platen 56 and the placement head 36. In addition to providing heat through the pulsed heating element 38, the platen 56 may be outfitted with a platen heater, so that the platen 56 may be maintained at an intermediate temperature between room temperature and the melting temperature of the substrate solder bumps 50. The placement head 36 may include an internal heating element or, as shown in FIGS. 2 and 3, the affixed pulsed heating element 38. In another embodiment, the region containing the substrate 34 and die 32 may be heated by an external source.

Figure 4:
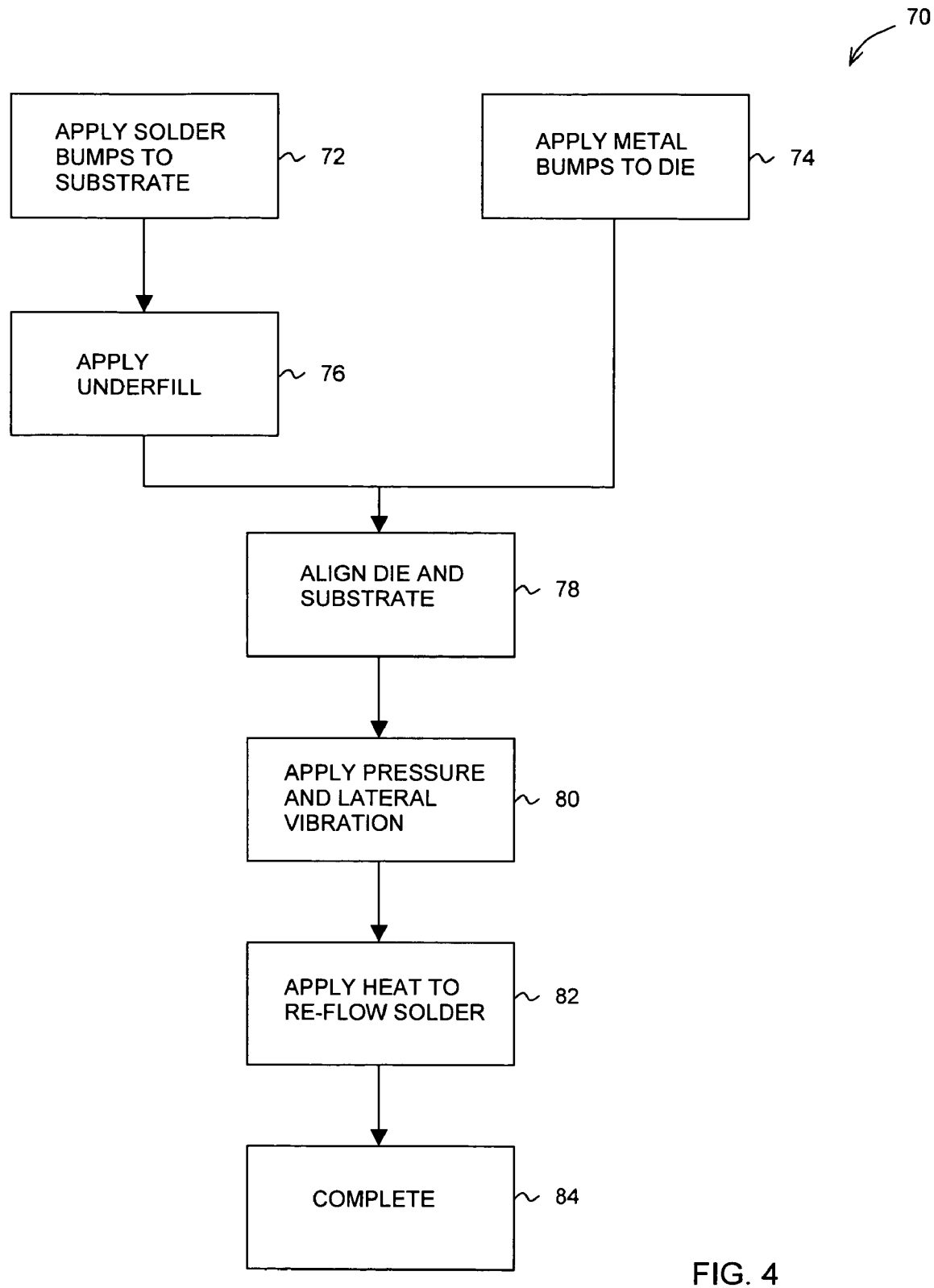
FIG. 4 is a flow chart of the assembly process, according to one method of the present invention, for assembling the IC package of FIGS. 2 and 3 using the die attachment tool of FIG. 2.

In FIG. 4 a flow chart of a die attachment process 70 is shown. Referring to FIGS. 2, 3 and 4, the process 70 begins with the substrate solder bumps 50 at a block 72 and the die metal bumps 46 at a block 74 being deposited on the bonding pads of the substrate 34 and the die 32, respectively. At the block 72, the substrate solder bumps 50 may be applied to the bond pads of the substrate 34 by using any of a number of techniques, including, but not limited to, vapor deposition and electroplating. After the substrate solder bumps 50 are applied, the substrate 34 may be heated to beyond the solder's melting point to re-flow the solder to facilitate complete wetting of the bond pads of the substrate 34. At the block 74, the substrate metal bumps 46 may be applied to the bonding pads of the die 32 by any number of techniques including, but not limited to, vapor deposition, plating, and wire bumping. As previously mentioned, in another embodiment, the solder bumps may be applied to the die and the metal bumps may be applied to the substrate.

At a block 76, the no-flow underfill material 60, with or without fillers 62, may be dispensed in liquid form to create a layer on the die-side 51 of the substrate 34. The underfill material 60 may be used to fill the gap between the die 32 and the substrate 34 to increase the longevity, environmental resistance, and fatigue strength of the solder joints. However, the underfill material 60 may need to be cured later in the assembly process 70 to accomplish these desired characteristics.

At a block 78, the die attachment tool 30 may align the array of die metal bumps 46 and the matching array of substrate solder bumps 50. More specifically, the die 32 may be picked up by the placement head 36 of the die attachment tool 30 and aligned with the substrate 34 with the center axis 52 of the placement head 36.

At a block 80, using the placement head 36 and the platen 56, the placement head 36 may be moved along the center axis 52, as shown by the vertical arrow 59, so that the die metal bumps 46 come into contact with the substrate solder bumps 50. Upon contact, the placement head 36 and platen 56 apply a compressive force or pressure parallel to the center axis 52. At the same time, a vibrating force or wave is introduced by the vibration mechanism 53 in a direction substantially perpendicular to the center axis 52. As previously described, the downward compression force may form the bonds between bumps 46 and 50, while the lateral vibration may assist in sweeping out the underfill material 60 and fillers 62 from the solder joints formed between the bumps 46 and 50. In summary, the bumps 46 and 50 are brought into contact and then pressure is applied with a laterally-applied vibration.

At block 82, the die attachment tool 30, in addition to applying pressure through the placement head 36 and the platen 56, may also provide heat through the platen 56 and a placement head 36. As previously described, the placement head 36 may include the pulsed heating element 38 and the platen 56 may have a platen heater, so that the platen 56 may be maintained at an intermediate temperature between room temperature and the melting temperature of the substrate solder bumps 50. Likewise, the plused heating element 38 may be maintained at an intermediate temperature. Then the pulse heat element 38 may rapidly provide heat to a temperature in excess of the melting point of the substrate solder bumps 50 so as to allow the re-flow of the solder of the substrate solder bumps 50 without melting the die metal bumps 46. Proximate with reaching the re-flow temperature at the substrate solder bumps 50, the compression force may be released. The solder of the substrate solder bumps 50 may be held above its re-flow temperature for several seconds to facilitate wetting of the die metal bumps 46 and their joining to form the solder joints.

At block 84, the underfill material 60 of the assembled IC package 35 may be cured, along with other processes to complete the IC package 35.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method comprising:
   providing a die having a first side with a plurality of die bumps and a substrate having a second side with a plurality of substrate bumps, with a selected one of the plurality of die bumps and the plurality of substrate bumps being a plurality of solder bumps and the non-selected one of the plurality of die bumps and the plurality of substrate bumps being a plurality of metal bumps;

forming a layer of underfill material on a surface having the plurality of solder bumps;

moving at least a selected one of the die and the substrate to bring the plurality of die bumps into contact with the plurality of substrate bumps after forming the layer of underfill material;

vibrating at least a selected one of the die and the substrate while the die bumps and the substrate bumps are in contact to impart a substantially lateral oscillating motion to reduce entrapment of the underfill material between the die bumps and the substrate bumps; and reflowing the plurality of solder bumps to join the plurality of solder bumps to the plurality of metal bumps by heating the plurality of solder bumps with a heater to a given temperature, with the given temperature being equal to or greater than a melting point temperature of the solder bumps and less than a melting point temperature of the metal bumps.

2. The method according to claim 1, wherein the vibrating comprises vibrating at least one of the selected one(s) at a predetermined frequency.

3. The method according to claim 1, wherein the vibrating comprises vibrating at least one of the selected one(s) with an oscillating force applied substantially parallel to at least a selected one of the first and the second sides to impart the lateral oscillating motion.

4. The method according to claim 1, wherein the vibrating comprises vibrating the die.

5. The method according to claim 1, wherein the moving comprises moving the selected one(s) along a path; and the method further comprises centering the die and the substrate over the path.

6. The method according to claim 1, wherein the providing of the die comprises providing the die to be removably mounted in a placement head of a die attachment tool; and the vibrating of the selected one of the die and substrate includes vibrating the placement head having the die mounted thereto.

7. The method according to claim 6, wherein the providing of the substrate comprises providing the substrate mounted on a platen; and the moving includes moving the placement head towards the substrate.

8. The method according to claim 1, wherein the method further comprises applying a compressive force to the pluralities of die bumps and substrate bumps upon the plurality of die bumps and the plurality of substrate bumps being brought into contact.

9. The method according to claim 1, wherein the providing of the die having the first side with the plurality of die bumps and the substrate having the second side with the plurality of substrate bumps includes providing the plurality of die bumps to be the metal bumps and the plurality of substrate bumps to be the solder bumps.

10. A system, comprising:

a die attachment tool having a placement bead adapted to allow a die to be removably mounted thereto, the die having a plurality of die bumps, a platen adapted to allow a substrate to be removably mounted thereto, the substrate having plurality of substrate bumps, with a selected one of the plurality of die bumps and the plurality of substrate bumps being a plurality of solder bumps, a vibration mechanism, mechanically coupled to at least a selected one of the placement head and the platen, adapted to vibrate the selected one while the die and the substrate are brought into contact, to impart a substantially lateral oscillation motion to reduce entrapment of underfill materials between the die bumps and the substrate bumps, and a heater to reflow the plurality of solder bumps at a given temperature after the die and the substrate bumps come into contact to join the die and the substrate bumps with the plurality of solder bumps having a lower melting point than the plurality of metal bumps so that when the plurality of solder bumps are reflowed at the given temperature the plurality of metal bumps do not melt; and a controller coupled to the die attachment tool to control operation of the die attachment tool.

11. The system according to claim 10, wherein the placement head has a center axis, and the vibration mechanism is operable to vibrate at least one of the selected one(s) with an oscillating force applied substantially perpendicular to the center axis to impart the lateral oscillating motion.

12. The system according to claim 10, wherein the apparatus further comprises a motorized mechanism coupled to at least a selected one of the placement head and the platen to move at least one of the selected one(s) to bring a mounted die into contact with a mounted substrate.

13. The method according to claim 1, wherein the vibrating of at least a selected one of the die and the substrate includes stressing the underfill material to decrease its viscosity.

14. The method according to claim 1, wherein the plurality of substrate bumps are the plurality of solder bumps; and the vibrating of at least a selected one of the die and the substrate while the die bumps and the substrate bumps are brought into contact includes sweeping the substrate bumps with the die bumps.

15. The method according to claim 1, further comprising:

applying compressive forces between the plurality of die bumps and the plurality of substrate bumps after the die and the substrate bumps have been brought into contact; and releasing the compressive forces substantially at a time when a reflow temperature of the plurality of solder bumps is reached.

16. The system according to claim 10, wherein the vibration mechanism is adapted to stress the underfill material to decrease its viscosity.

* * * * *

UNITED STATES PATENT AND TRADEMARK OFFICE
CERTIFICATE OF CORRECTION

| | |
|---|---|
| PATENT NO. | : 7,147,735 B2 |
| APPLICATION NO. | : 10/897706 |
| DATED | : December 12, 2006 |
| INVENTOR(S) | : Caskey et al. |

It is certified that error appears in the above-identified patent and that said Letters Patent is hereby corrected as shown below:

Column 7
Line 56, "...placement bead..." should read --...placement head...--.

Signed and Sealed this

Twentieth Day of October, 2009

David J. Kappos
*Director of the United States Patent and Trademark Office*